US006973113B2

(12) United States Patent
Albrecht et al.

(10) Patent No.: US 6,973,113 B2
(45) Date of Patent: Dec. 6, 2005

(54) OPTICALLY PUMPED SEMICONDUCTOR LASER DEVICE

(75) Inventors: Tony Albrecht, Bad-Abbach (DE); Norbert Linder, Wenzenbach (DE); Wolfgang Schmid, Deuerling/Hillohe (DE)

(73) Assignee: OSRAM GmbH, Munich (DE)

( * ) Notice: Subject to any disclaimer, the term of this patent is extended or adjusted under 35 U.S.C. 154(b) by 147 days.

(21) Appl. No.: 10/444,800

(22) Filed: May 23, 2003

(65) Prior Publication Data

US 2004/0042523 A1 Mar. 4, 2004

(30) Foreign Application Priority Data

May 27, 2002 (DE) ................................ 102 23 540

(51) Int. Cl.[7] ................................................ H01S 3/091
(52) U.S. Cl. .......................... 372/70; 372/50.1; 372/75
(58) Field of Search ............................... 372/50, 70, 75

(56) References Cited

U.S. PATENT DOCUMENTS 5,038,356 A * 8/1991 Botez et al. .................. 372/45
5,461,637 A * 10/1995 Mooradian et al. ........... 372/92
5,747,366 A * 5/1998 Brillouet et al. .............. 438/44
5,956,362 A * 9/1999 Yokogawa et al. ........... 372/46
6,535,537 B1 * 3/2003 Kinoshita .................... 372/50
6,542,530 B1 * 4/2003 Shieh et al. .................. 372/46
6,778,582 B1 * 8/2004 Mooradian ................... 372/97
2002/0001328 A1 * 1/2002 Albrecht et al. .............. 372/50
2002/0075935 A1 * 6/2002 Clayton ....................... 372/75

FOREIGN PATENT DOCUMENTS

DE 10026734 12/2001
WO WO 01/13481 2/2001
WO WO 01/93386 12/2001

* cited by examiner

*Primary Examiner*—Minsun Oh Harvey
*Assistant Examiner*—James Menefee
(74) *Attorney, Agent, or Firm*—Cohen, Pontani, Lieberman & Pavane

(57) ABSTRACT

An optically pumped semiconductor laser device having a substrate (1) having a first main area (2) and a second main area (3), with at least one pump laser (11) being arranged on the first main area (2). The semiconductor laser device comprises a vertically emitting laser (4) having a resonator having a first mirror (9) being arranged on the side of the first main area (2) and a second mirror (20) being arranged on the side of the second main area (3) of the substrate (1).

30 Claims, 2 Drawing Sheets

OPTICALLY PUMPED SEMICONDUCTOR LASER DEVICE

FIELD OF THE INVENTION

The invention relates to a semiconductor laser device and, more particularly, to an optically pumped semiconductor laser device including a substrate having a first main area and a second main area, with at least one pump laser arranged on the first main area.

BACKGROUND OF THE INVENTION

An optically pumped radiation-emitting semiconductor device is disclosed for example in DE 100 26 734.3, which describes an optically pumped quantum well structure which is arranged together with a pump radiation source, for example a pump laser, on a common substrate. The radiation generated by the quantum well structure is in this case coupled out through the substrate.

Furthermore, a mirror is integrated on that side of the quantum well structure which is remote from the substrate, which mirror, in conjunction with an external mirror, can form the resonator of a laser whose active medium is the quantum well structure.

The space requirement for external mirrors is comparatively high in relation to the optically pumped semiconductor device. Moreover, in the case of a resonator formed with external mirrors, the resonator losses depend greatly on the alignment of the mirrors with regard to the optically pumped semiconductor device. Therefore, a complicated alignment of the mirrors is generally necessary. Moreover, during operation, for example on account of changes in temperature, a misalignment may result which impairs the efficiency of the laser and/or the beam quality thereof.

SUMMARY OF THE INVENTION

It is an object of the present invention to provide an optically pumped semiconductor laser device which has a compact construction and a small space requirement. In particular, the intention is for the semiconductor laser device not to require an external mirror.

This and other objects are obtained in accordance with one aspect of the invention directed to an optically pumped semiconductor laser device having a substrate having a first main area and a second main area. At least one pump laser is arranged on the first main area. The semiconductor laser device has a vertically emitting laser having a resonator having a first mirror and a second mirror. The laser device is optically pumped by the pump laser with the first mirror being arranged on the side of the first main area and the second mirror being arranged on the side of the second main area of the substrate.

Another aspect of the invention is directed to an optically pumped semiconductor laser device having a substrate having a first main area and a second main area. At least one pump laser is arranged on the first main area. The semiconductor laser device has a vertically emitting laser having a resonator having a first mirror arranged on the side of the first main area. A recess or a perforation running from the first to the second main area is formed in the substrate. A second mirror is arranged within the recess or the perforation.

In a first embodiment, the invention provides an optically pumped semiconductor laser device having a substrate having a first main area and a second main area and also a vertically emitting laser. The vertically emitting laser has a resonator having a first and a second mirror, the first mirror being arranged on the side of the first main area and the second mirror being arranged on the side of the second main area of the substrate. Furthermore, at least one pump laser for pumping the vertically emitting laser is provided on the first main area.

In a second embodiment of the invention, in contrast to the first embodiment, the substrate has a recess on the side of the second main area or a perforation running from the second to the first main area. In this case, the second mirror is arranged within the perforation or the recess.

In this embodiment, the proportion of the resonator-internal substrate material in the vertically emitting laser is reduced and an absorption loss occurring in the substrate is thus advantageously reduced.

It is preferably the case in both embodiments that the first mirror, which may be formed as a Bragg mirror, for example, forms the resonator end mirror and the second mirror forms the coupling-out mirror. Designing the first mirror as a Bragg mirror advantageously enables a high degree of reflection in conjunction with low absorption losses in the mirror. Furthermore, known and established epitaxy methods can be employed for producing such a mirror.

In an advantageous development of the invention, the coupling-out mirror is embodied in curved fashion and/or and a lens is arranged in the resonator of the vertically emitting laser. This advantageously increases the mode selectivity and the stability of the laser compared with a planar-planar Fabry-Perot resonator.

In the case of the invention, the vertically emitting laser is preferably formed from undoped semiconductor material at least in partial regions. Compared with doped semiconductor material, as is usually used in electrically pumped semiconductor lasers, this advantageously reduces the absorption of the laser radiation in the semiconductor material in the vertically emitting laser. The low electrical conductivity of undoped semiconductor material is not disadvantageous in this case since the vertically emitting laser is pumped optically rather than electrically. A reduction of the absorption can be achieved in particular by using an undoped substrate.

In a preferred refinement of the invention, the radiation-emitting active layer of the vertically emitting laser is designed as a quantum well structure, particularly preferably as a multiple quantum well structure (MQW structure). Compared with electrically pumped lasers, in the case of an optically pumped laser, the quantum well structure can be formed with significantly more quantum wells and/or a larger lateral cross section and a high gain and optical output power can be achieved as a result.

In electrically pumped lasers, increasing the power by scaling up the laser structure is associated with difficulties, for example with regard to homogeneous distribution of the pump current in conjunction with a high pump density and low power loss. In particular, this requires a doping of the semiconductor material which forms the laser structure, as a result of which the absorption of the laser radiation is increased.

In the case of the invention, pump laser and vertically emitting laser are preferably embodied in monolithic integrated fashion. In the case of the vertically emitting laser, the monolithic integration relates to the region which is arranged on the same side of the substrate as the pump laser. The active layers of pump laser and vertically emitting laser are preferably formed at the same distance from the first main area of the substrate, so that the radiation generated by the pump laser, for example in the manner of an edge emitter, is coupled, propagating in the lateral direction, into the active layer of the vertically emitting laser.

Further features, advantages and expediencies of the invention emerge from the following description of three exemplary embodiments in conjunction with FIGS. 1 to 3.

DETAILED DESCRIPTION OF THE DRAWINGS

Identical or identically acting elements are provided with the same reference symbols in the figures.

Figure 1:
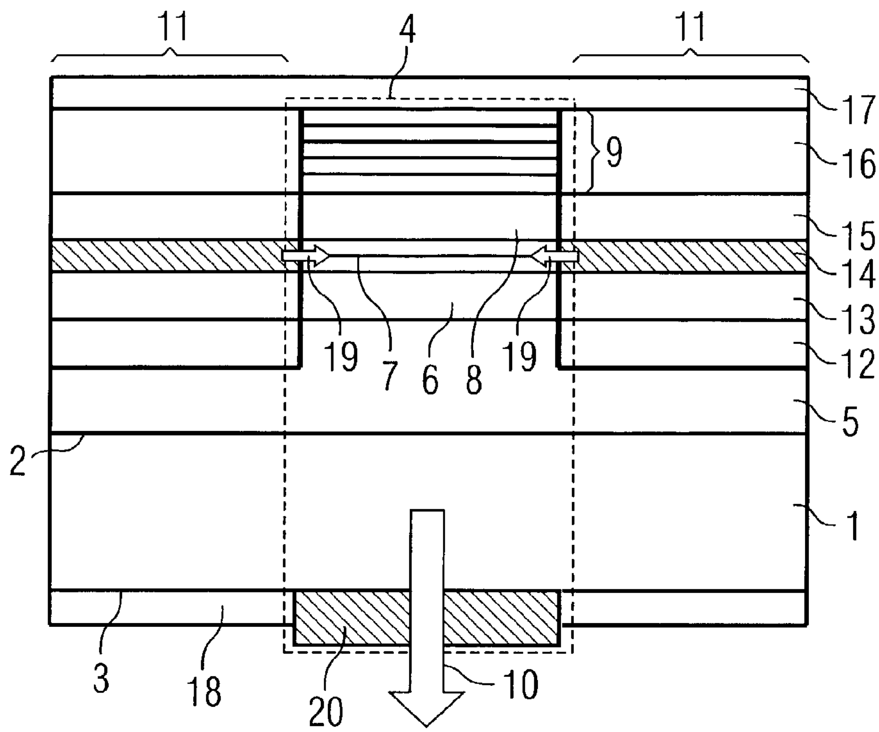
FIG. 1 shows a diagrammatic sectional view of a first exemplary embodiment of a semiconductor laser device according to the invention.

The optically pumped semiconductor laser device illustrated in section in FIG. 1 corresponds to the first embodiment of the invention.

The semiconductor laser device has a substrate 1 having a first main area 2 and a second main area 3. Two pump lasers 11 and also part of a vertically emitting laser 4 are arranged on the first main area. The pump laser 11 and that part of the vertically emitting laser which is located on the side of the first main area 2 are preferably of monolithic integrated design.

A buffer layer 5 is applied over the whole area on the first main area 2 of the substrate The vertically emitting laser 4 comprises, following the buffer layer 5, a first waveguide layer 6, a radiation-emitting quantum well structure 7, which is preferably embodied as a multiple quantum well structure, a second waveguide layer 8 and a first mirror 9, preferably in the form of a Bragg mirror having a plurality of successive mirror layers.

A second mirror 20 of the vertically emitting laser 4 is arranged on the opposite second main area 3, which mirror, together with the first mirror 9, forms the laser resonator of the vertically emitting laser. The second mirror is partly transmissive for the radiation 10 generated by the vertically emitting laser and serves as a coupling-out mirror.

A pump laser 11 is in each case arranged on both sides laterally adjacent to the vertically emitting laser 4. The pump lasers comprise, following the buffer layer 5, in each case a first cladding layer 12, a first waveguide layer 13, an active layer 14, a second waveguide layer 15 and a second cladding layer 16. A continuous p-type contact layer 17 adjoining the second cladding layer is applied on the top side. An n-type contact layer 18 is formed on the opposite side on the second main area 3 of the substrate in the region of the pump lasers 11. These contact layers 17, 18 serve for the electrical supply of the pump lasers 11.

By way of example, compounds from the GaAs/AlGaAs material system may be used as semiconductor material in the case of the invention. Semiconductor materials such as, for example InAlGaAs, InGaAlP, InGaN, InAlGaN or InGaAlAs are more widely suitable besides GaAs and AlGaAs.

During operation, laser radiation 19, referred to below as pump radiation, is generated in the active layer 14 of the pump lasers 11 and optically pumps the quantum well structure 7 of the vertically emitting laser 4. In this case, the waveguide layers 13, 15 of the pump lasers serve for the lateral guidance and spatial confinement of the pump radiation field, so that the pump radiation 19 is coupled laterally into the quantum well structure.

The waveguide layers 6, 8 of the vertically emitting laser 4 likewise serve for the guidance and spatial confinement of the pump radiation field, in order to achieve an as extensive as possible concentration of the pump radiation 9 in the region of the quantum well structure to be pumped.

The wavelength of the pump radiation 19 is shorter than the wavelength of the radiation 10 generated by the vertically emitting laser and is chosen such that the pump radiation is absorbed as completely as possible in the quantum well structure.

As a result of the optical pump process, a laser radiation field 10 is induced in the resonator formed by the first mirror 9 and the second mirror 20, which field is amplified by stimulated emission in the quantum well structure 7 and coupled out through the second mirror 20.

The semiconductor laser device shown is preferably produced epitaxially. In this case, in a first epitaxy step, there are grown on the substrate 1 firstly the buffer layer 5 and afterward, both in the region of the vertically emitting laser 4 and in the region of the pump lasers 11, the structure for the vertically emitting laser, that is to say the waveguide layer 6, the quantum well structure 7 and the waveguide layer 8 and the mirror 9. This structure is then removed, for example etched away, in the region of the pump lasers 11 right into the buffer layer 5.

On the region of the buffer layer 5 that has been uncovered in this way, the above-described layers 12, 13, 14, 15, 16 for the pump lasers are then deposited one after the other in a second epitaxy step. Finally, the p-type contact layer 17 extending over the pump lasers 11 and the vertically emitting laser 4 is applied on the top side, The second mirror 20 on the opposite second main area 3 may be grown epitaxially, for example in the form of a Bragg mirror, or be formed as a dielectric mirror. A thin metal layer that is partly transmissive for the laser radiation 10 as second mirror 20 would likewise be possible, a Bragg mirror or a dielectric mirror being preferred on account of the lower absorption in comparison with a metal mirror.

The main areas 2, 3 of the substrate 1 usually have a very high planarity and parallelism with respect to one another. This is also necessary, inter alia, for a defined deposition of epitaxial layers of predetermined thickness. The invention thus advantageously achieves a parallel orientation of the mirrors 9 and 20 with respect to one another with high precision.

Furthermore, unthinned substrates having a thickness of greater than or equal to 100 $\mu$m, preferably greater than or equal to 200 $\mu$m, particularly preferably greater than or equal to 500 $\mu$m, may advantageously be used in this embodiment of the invention. This results in a mirror spacing which is comparatively large for such semiconductor lasers and is advantageous with regard to the mode selection in the vertically emitting laser 4.

Figure 2:
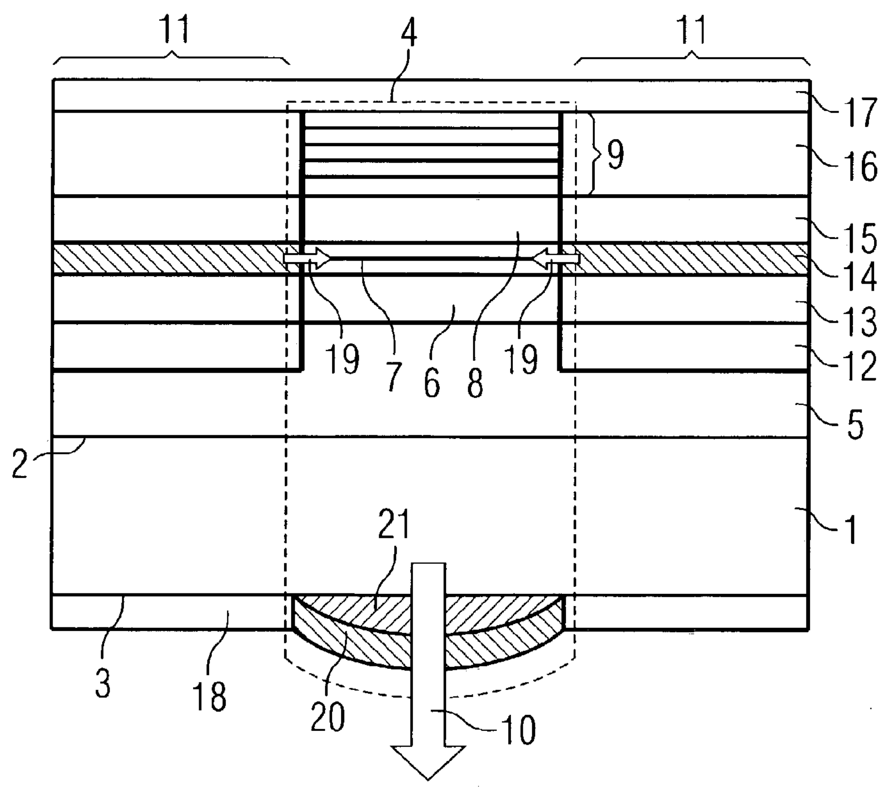
FIG. 2 shows a diagrammatic sectional view of a second exemplary embodiment of a semiconductor laser device according to the invention.

FIG. 2 illustrates a second exemplary embodiment of the invention in the first embodiment.

The structure of the optically pumped semiconductor laser device on the first main area 2 of the substrate 1 and also the n-type contact layer 18 essentially correspond to the first exemplary embodiment.

In contrast to the first exemplary embodiment, the vertically emitting laser 4 has a planoconvex lens 21, which is formed on the second main area 3 of the substrate and to which the coupling-out mirror 20 is applied in a positively locking manner.

Such a lens may be produced for example by means of an etching method in that firstly a photoresist layer is applied and is then exposed using a grey-shade mask, thus producing a lens-shaped photoresist region. As an alterative, the photoresist layer can also be exposed using a black-and-white mask in such a way that firstly a cylindrical photoresist region is formed, which then passes into lens form at elevated temperature. During a subsequent etching step, which may be effected for example in dry-chemical fashion by means of an RIE method (Reactive Ion Etching) or an ICP-RIE method (Inductive Coupled Plasma Reactive Ion Etching), the resist form is transferred to the semiconductor material.

In this case, the lens 21 or the curved coupling-out mirror 20 acts as a mode-selective element, so that it is preferably the fundamental mode which builds up oscillations and is amplified in the laser resonator of the vertically emitting laser. Furthermore, the stability of the laser resonator is thus increased in comparison with the Fabry-Perot resonator shown in FIG. 1.

Figure 3:
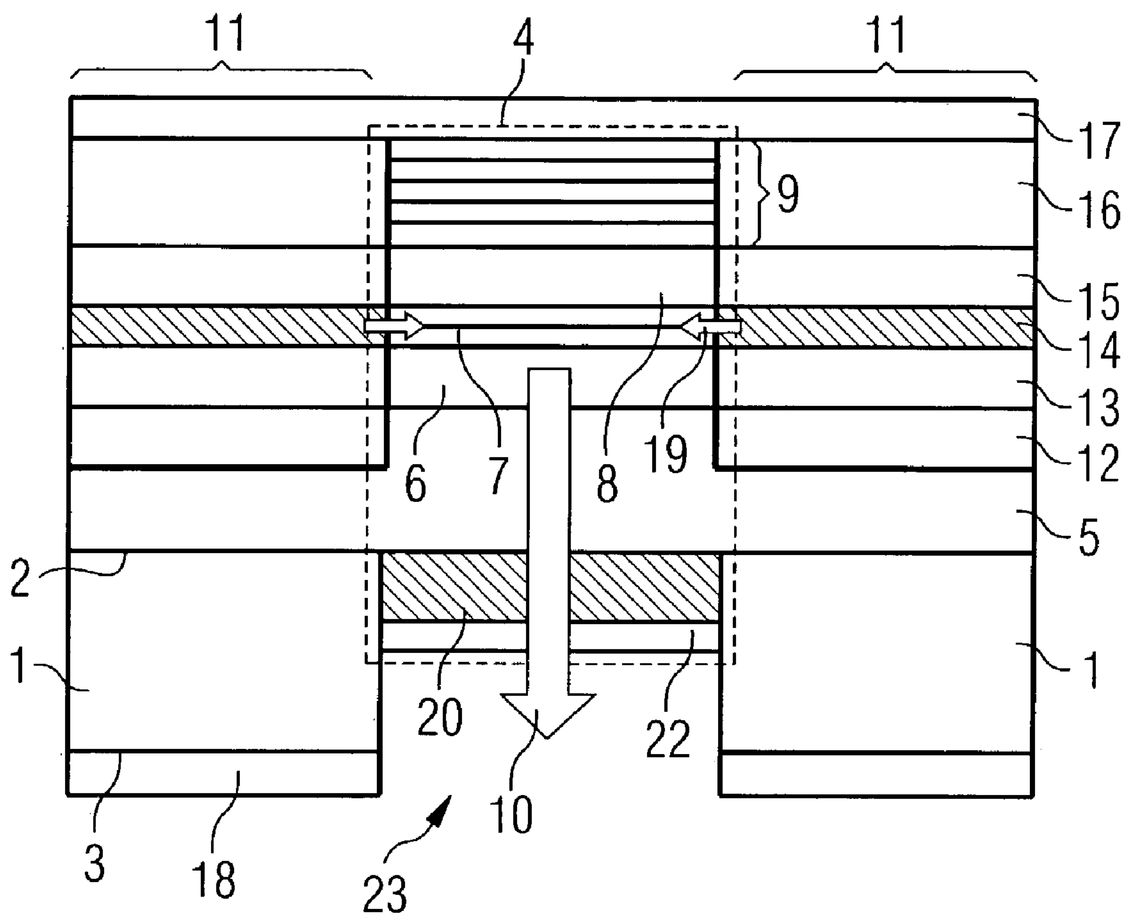
FIG. 3 shows a diagrammatic sectional view of a third exemplary embodiment of a semiconductor laser device according to the invention.

FIG. 3 illustrates a third exemplary embodiment of the invention in accordance with the second embodiment.

The structure of the optically pumped semiconductor laser device on the first main area 2 of the substrate 1 and also the n-type contact layer 18 essentially correspond to the first exemplary embodiment.

In contrast thereto, in the region of the vertically emitting laser, the substrate 1 has a perforation 23, which runs from the first main area 2 to the second main area 3 and in which the coupling-out mirror 21 is arranged in such a way that it adjoins the buffer layer 5. A protective layer 22 may optionally be applied on the coupling-out mirror. Such a protective layer 22, for example in the form of an antireflection or passivation layer, is particularly expedient if the coupling-out mirror is designed as a Bragg mirror. In the case of a dielectric mirror as coupling-out mirror, a protective layer is not necessary and can be omitted.

As an alternative, a recess (not illustrated) may be formed in the substrate 1 from the second main area, the coupling-out mirror 20 being arranged in said recess. Such a recess or such a perforation may be formed by means of an etching method, for example.

In both variants, with respect to the exemplary embodiments shown in FIGS. 1 and 2, the resonator-internal optical path in the substrate 1 is reduced and is even completely eliminated in the exemplary embodiment illustrated. The reduction of the substrate proportion through which the laser radiation 10 passes advantageously results in a decrease in resonator-internal absorption losses in the substrate 1.

In a further exemplary embodiment of the invention, the substrate is undoped, both contacts for the electrical supply of the pump lasers expediently being arranged on the side of the first main area. The comparatively low absorption of the radiation generated by the vertically emitting laser is advantageous in the case of undoped substrates.

The description of the exemplary embodiments is not to be understood as a restriction of the invention. The invention is embodied in each novel characteristic and each combination of characteristics, which includes every combination of any features which are stated in the claims, even if this combination of features is not explicitly stated in the claims. It is also possible to combine individual elements of the exemplary embodiments, for example a substrate with a recess or a perforation and a lens arranged therein.

What is claimed is:

1. An optically pumped semiconductor laser device, comprising:

a substrate having a first main area and a second main area; and at least one pump laser arranged on the first main area;

wherein the semiconductor laser device has a vertically emitting laser having a resonator having a first mirror and a second mirror, said laser being optically pumped by the at least one pump laser, the first mirror being arranged on the side of a first main area and the second mirror being arranged on the second main area of the substrate.

2. The semiconductor laser device as claimed in claim 1, wherein radiation generated by the vertically emitting laser is coupled out through the second mirror.

3. The semiconductor laser device as claimed in claim 1, wherein the second main area is parallel to the first main area.

4. The semiconductor laser device as claimed in claim 1, wherein the vertically emitting laser and the at least one pump laser are monolithically integrated.

5. The semiconductor laser device as claimed in claim 1, wherein a lens is arranged between the second mirror and the first mirror.

6. The semiconductor laser device as claimed in claim 1, wherein the second mirror has a curved configuration.

7. The semiconductor laser device as claimed in claim 1, wherein the first mirror is configured as a Bragg mirror.

8. The semiconductor laser device as claimed in claim 1, wherein the second mirror is configured as a Bragg mirror or as a dielectric mirror.

9. The semiconductor laser device as claimed in claim 1, wherein the semiconductor laser device is formed from an undoped semiconductor material at least partly in a region of the vertically emitting laser.

10. The semiconductor laser device as claimed in claim 1, wherein the substrate is undoped.

11. The semiconductor laser device as claimed in claim 1, wherein the vertically emitting laser has a radiation-emitting active layer configured as a quantum well structure.

12. The semiconductor laser device as claimed in claim 1, wherein radiation generated by the at least one pump laser for pumping the vertically emitting laser is coupled in a lateral direction into the vertically emitting laser or a quantum well structure.

13. The semiconductor laser device as claimed in claim 1, wherein a thickness of the substrate is greater than 100 $\mu$m.

14. The semiconductor laser device as claimed in claim 13, wherein the thickness of the substrate is greater than 200 $\mu$m.

15. The semiconductor laser device as claimed in claim 13, wherein the thickness of the substrate is greater than 500 $\mu$m.

16. An optically pumped semiconductor laser device comprising:

a substrate having a first main area and a second main area; and at least one pump laser arranged on the first main area;

wherein the semiconductor laser device has a vertically emitting laser having a resonator having a first mirror and a second mirror, said laser being optically pumped by the at least one pump laser, the first mirror being arranged on a side of the first main area, a recess or a perforation running from the first to the second main area being formed in the substrate, and the second mirror being arranged within the recess or the perforation.

17. The semiconductor laser device as claimed in claim 16, wherein radiation generated by the vertically emitting laser is coupled out through the second mirror.

18. The semiconductor laser device as claimed in claim 16, wherein the second main area is parallel to the first main area.

19. The semiconductor laser device as claimed in claim 16, wherein the vertically emitting laser and the at least one pump laser are monolithically integrated.

20. The semiconductor laser device as claimed in claim 16, wherein a lens is arranged between the second mirror and the first mirror.

21. The semiconductor laser device as claimed in claim 16, wherein the second mirror has a curved configuration.

22. The semiconductor laser device as claimed in claim 16, wherein the first mirror is configured as a Bragg mirror.

23. The semiconductor laser device as claimed in claim 16, wherein the second mirror is configured as a Bragg mirror or as a dielectric mirror.

24. The semiconductor laser device as claimed in claim 16, wherein the semiconductor laser device is formed from an undoped semiconductor material at least partly in a region of the vertically emitting laser.

25. The semiconductor laser device as claimed in claim 16, wherein the substrate is undoped.

26. The semiconductor laser device as claimed in claim 16, wherein the vertically emitting laser has a radiation-emitting active layer that is configured as a quantum well structure.

27. The semiconductor laser device as claimed in claim 16, wherein radiation generated by the at least one pump laser for pumping the vertically emitting laser is coupled in the lateral direction into the vertically emitting laser or a quantum well structure.

28. The semiconductor laser device as claimed in claim 16, wherein a thickness of the substrate is greater than 100 $\mu$m.

29. The semiconductor laser device as claimed in claim 26, wherein the thickness of the substrate is greater than 200 $\mu$m.

30. The semiconductor laser device as claimed in claim 26, wherein the thickness of the substrate is greater than 500 $\mu$m.

* * * * *